(12) United States Patent
Wang et al.

(10) Patent No.: US 12,432,969 B2
(45) Date of Patent: *Sep. 30, 2025

(54) ARRAY SUBSTRATE AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Jun Wang, Beijing (CN); Zhonghao Huang, Beijing (CN)

(73) Assignees: Chongqing BOE Optoelectronics Technology Co., Ltd., Chongqing (CN); BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/613,390

(22) Filed: Mar. 22, 2024

(65) Prior Publication Data
US 2024/0250176 A1    Jul. 25, 2024

Related U.S. Application Data

(63) Continuation of application No. 18/134,389, filed on Apr. 13, 2023, now Pat. No. 12,074,222, which is a
(Continued)

(30) Foreign Application Priority Data

Jul. 10, 2020  (CN) .......................... 202010663685

(51) Int. Cl.
*H01L 27/12* (2006.01)
*H01L 29/66* (2006.01)
(Continued)

(52) U.S. Cl.
CPC ..... *H10D 30/6723* (2025.01); *H10D 30/6755* (2025.01); *H10D 86/0221* (2025.01);
(Continued)

(58) Field of Classification Search
CPC ... H01L 27/1225; H01L 27/12; H01L 27/124; H01L 27/127; H01L 27/1288;
(Continued)

(56) References Cited

U.S. PATENT DOCUMENTS 9,570,473 B2    2/2017  Wang
9,841,864 B2   12/2017  Heynen et al.
(Continued)

FOREIGN PATENT DOCUMENTS

CN    104393000 A    3/2015
CN    105428313 A    3/2016
(Continued)

OTHER PUBLICATIONS

Notice of Allowance from U.S. Appl. No. 17/199,521 issued Jan. 13, 2023.
(Continued)

*Primary Examiner* — Nikolay K Yushin
(74) *Attorney, Agent, or Firm* — ArentFox Schiff LLP; Michael Fainberg (57) ABSTRACT

An array substrate, a display device and a fabrication method are provided. The array substrate includes a first metal layer at one side of a base substrate, the first metal layer including a light shielding part, a source, a drain in a display area; a second metal layer at a side, facing away from an active layer, of gate insulating layer, the second metal layer includes a gate, a source-landing electrode a drain-landing electrode in the display area, the source-landing electrode is in contact with the active layer and the source through a first via hole penetrating through the gate
(Continued)

insulating layer and a buffer layer and exposing one end of the active layer, the drain-landing electrode is in contact with the active layer and the drain through a second via hole penetrating through the gate insulating layer and the buffer layer and exposing other end of the active layer.

20 Claims, 10 Drawing Sheets

Related U.S. Application Data continuation of application No. 17/199,521, filed on Mar. 12, 2021, now Pat. No. 11,652,172.

(51) Int. Cl.
*H10D 30/67* (2025.01)
*H10D 86/01* (2025.01)
*H10D 86/40* (2025.01)
*H10D 86/60* (2025.01)
*H10D 99/00* (2025.01)

(52) U.S. Cl.
CPC ....... *H10D 86/0231* (2025.01); *H10D 86/423* (2025.01); *H10D 86/441* (2025.01); *H10D 86/60* (2025.01); *H10D 99/00* (2025.01)

(58) Field of Classification Search
CPC ........... H01L 27/1214; H01L 29/66969; H01L 29/78633; H01L 29/786; H01L 21/02365; H01L 29/66; H01L 29/7869; H01L 29/41733; H01L 29/417; H01L 2021/775; H01L 21/77; H01L 21/02282; H01L 21/076843; H01L 21/76864; H10B 69/00; H10D 30/6723; H10D 30/67; H10D 30/6755; H10D 30/6729; H10D 86/0221; H10D 86/01; H10D 86/0231; H10D 86/423; H10D 86/40; H10D 86/441; H10D 86/60; H10D 86/021; H10D 99/00
See application file for complete search history.

(56) References Cited

U.S. PATENT DOCUMENTS

| | | |
|---|---|---|
| 9,842,864 B2 | 12/2017 | Kim et al. |
| 9,847,869 B1 | 12/2017 | Wu et al. |
| 9,876,038 B2 | 1/2018 | Ma et al. |
| 2016/0027799 A1 | 1/2016 | Wang |
| 2016/0093647 A1 | 3/2016 | Kim et al. |

FOREIGN PATENT DOCUMENTS

| | | |
|---|---|---|
| CN | 105470262 A | 4/2016 |
| DE | 102015116395 A1 | 3/2016 |

OTHER PUBLICATIONS

Office Action from U.S. Appl. No. 17/199,521 issued Aug. 12, 2022.
Office Action received for Chinese Patent Application No. 202010663685.3, mailed on Jan. 12, 2023, 16 pages (9 pages of English Translation and 7 pages of Original Document).

ARRAY SUBSTRATE AND DISPLAY DEVICE

CROSS-REFERENCE TO RELATED APPLICATION

This application is a continuation of U.S. patent application Ser. No. 18/134,389 filed on Apr. 13, 2023, which is based on and claims priority under 35 U.S.C 119 to Chinese Patent Application No. 202010663685.3, filed on Jul. 10, 2020, in the China National Intellectual Property Administration. The entire disclosure of the above application is incorporated herein by reference.

FIELD

The present disclosure relates to the technical field of semiconductors, in particular to an array substrate, a display device and a fabrication method.

BACKGROUND

An FPD (Flat Panel Display) has become a mainstream product on the market, and there has been an increasing variety of flat panel displays such as an LCD (Liquid Crystal Display), an OLED (Organic Light Emitted Diode) display, a PDP (Plasma Display Panel) and an FED (Field Emission Display).

SUMMARY

An embodiment of the present disclosure provides an array substrate, including a display area and a non-display area located at a periphery of the display area, and includes:
a base substrate;
a first metal layer located at one side of the base substrate, the first metal layer includes a light shielding part, a source and a drain, the light shielding part, the source and the drain are located in the display area;
a buffer layer located at a side, facing away from the base substrate, of the first metal layer;
an active layer located at a side, facing away from the first metal layer, of the buffer layer and located in the display area;
a gate insulating layer located at a side, facing away from the buffer layer, of the active layer; and
a second metal layer located at a side, facing away from the active layer, of the gate insulating layer, wherein the second metal layer includes a gate, a source landing electrode and a drain landing electrode, the source landing electrode is in contact with the active layer and the source through a first via hole exposing one end of the active layer, and the drain landing electrode is in contact with the active layer and the drain through a second via hole exposing the other end of the active layer;
a quantity of layers through which the first via hole penetrates is equal to a quantity of layers through which the second via hole penetrates.

In some embodiments, the first via hole includes a first part and a second part on the gate insulating layer, wherein the first part is located at a side, facing away from the buffer layer, of the active layer, the second part is located on a layer same with a layer where the active layer is, and an orthographic projection of the first part on the base substrate covers an orthographic projection of the second part on the base substrate; and
the second via hole includes a third part and a fourth part on the gate insulating layer, the third part is located at the side, facing away from the buffer layer, of the active layer, the fourth part is located on a layer same with the layer where the active layer is, and an orthographic projection of the third part on the base substrate covers an orthographic projection of the fourth part on the base substrate.

In some embodiments, the first part includes a first subpart in contact with the second part and a second subpart connected with the first subpart, the first via hole exposes one end of the active layer through the second subpart; and
the third part includes a third subpart in contact with the fourth part and a fourth subpart connected with the third subpart, and the second via hole exposes the other end of the active layer through the fourth subpart.

In some embodiments, a length of a surface, in contact with the active layer, of the second subpart is 3-5 micrometers in a direction parallel to a first direction;
a length of a surface, in contact with the active layer, of the fourth subpart is 3-5 micrometers in a direction parallel to the first direction;
wherein the first direction is a direction where the source landing electrode points to the gate.

In some embodiments, a minimum dimension of a gap formed between the source landing electrode and the gate in the direction parallel to the first direction is greater than a minimum dimension of a gap formed between the source and the light shielding part in the direction parallel to the first direction; and
a minimum dimension of a gap formed between the drain landing electrode and the gate in the direction parallel to the first direction is greater than a minimum dimension of a gap formed between the drain and the light shielding part in the direction parallel to the first direction.

In some embodiments, the first metal layer further includes a first signal line located in the non-display area; and
the second metal layer further includes a second signal line located in the non-display area, wherein the second signal line and the first signal line are conductive through a third via hole penetrating through the gate insulating layer and the buffer layer.

In some embodiments, the first metal layer further includes a data line which is located in the display area and extends in a second direction; and
the second metal layer further includes a gate line which is located in the display area and extends in a third direction.

In some embodiments, the array substrate further includes:
a passivation layer located at a side, facing away from the gate insulating layer, of the second metal layer; and
a pixel electrode located at a side, facing away from the second metal layer, of the passivation layer and located in the display area, wherein the pixel electrode and the drain landing electrode are conductive through a fourth via hole penetrating through the passivation layer.

In some embodiments, the passivation layer includes a first passivation layer and a second passivation layer located at a side, facing away from the second metal layer, of the first passivation layer;
an organic film layer located at the side, facing away from the second metal layer, of the first passivation layer, the organic film layer being provided with a via hole in an area where the fourth via hole is located; and a common electrode layer located at a side, facing away from the first passivation layer, of the organic film layer and located in the display area, the common electrode layer includes a via hole in the area where the fourth via hole is located.

An embodiment of the present disclosure further provides a display device, including the array substrate provided by some embodiments of the present disclosure.

An embodiment of the present disclosure further provides a fabrication method of an array substrate, wherein the array substrate includes a display area and a non-display area located at a periphery of the display area, the fabrication method includes:

forming, by adopting a primary masking process, a first metal layer including a light shielding part, a source and a drain in the display area at one side of a base substrate;

forming a buffer layer at a side, facing away from the base substrate, of the first metal layer;

forming an active layer in the display area at a side, facing away from the first metal layer, of the buffer layer;

forming a gate insulating layer at a side, facing away from the buffer layer, of the active layer, and forming a first via hole exposing one end of the active layer and a second via hole exposing the other end of the active layer; a quantity of layers through which the first via hole penetrates is equal to a quantity of layers through which the second via hole penetrates; and forming, by adopting the primary masking process, a second metal layer including a gate, a source landing electrode and a drain landing electrode in the display area at a side, facing away from the active layer, of the gate insulating layer, wherein the source landing electrode is in contact with the active layer and the source through the first via hole, and the drain landing electrode is in contact with the active layer and the drain through the second via hole.

In some embodiments, the forming the first via hole penetrating through the gate insulating layer and the buffer layer and exposing one end of the active layer and the second via hole penetrating through the gate insulating layer and the buffer layer and exposing the other end of the active layer includes:

simultaneously etching, by adopting a dry etching process, the gate insulating layer and the buffer layer to form the first via hole and the second via hole.

In some embodiments, in response to that the light shielding part, the source and the drain are formed in the display area at one side of the base substrate, the fabrication method further includes:

forming a first signal line in the non-display area at one side of the base substrate, and forming a data line, extending in a second direction, in the display area at one side of the base substrate.

In some embodiments, in response to that the gate, the source landing electrode and the drain landing electrode are formed in the display area at the side, facing away from the active layer, of the gate insulating layer, the fabrication method further includes:

forming a second signal line in the non-display area at a side, facing away from the active layer, of the gate insulating layer, and forming a gate line, extending in a third direction, in the display area at the side, facing away from the active layer, of the gate insulating layer, wherein the second signal line and the first signal line are conductive through a third via hole penetrating through the gate insulating layer and the buffer layer.

In some embodiments, after the second metal layer including the gate, the source landing electrode and the drain landing electrode is formed in the display area at the side, facing away from the active layer, of the gate insulating layer, the fabrication method further includes:

forming a passivation layer at a side, facing away from the gate insulating layer, of the second metal layer; and forming a pixel electrode at a side, facing away from the second metal layer, of the passivation layer, wherein the pixel electrode and the drain landing electrode are conductive through a fourth via hole penetrating through the passivation layer.

In some embodiments, the forming the passivation layer at the side, facing away from the gate insulating layer, of the second metal layer includes:

forming a first passivation layer at the side, facing away from the gate insulating layer, of the second metal layer;

forming a second passivation layer at a side, facing away from the second metal layer, of the first passivation layer;

wherein after the forming the first passivation layer at the side, facing away from the gate insulating layer, of the second metal layer, and before the forming the second passivation layer at the side, facing away from the second metal layer, of the first passivation layer, the fabrication method further includes:

forming an organic film layer at the side, facing away from the second metal layer, of the first passivation layer, and forming a via hole, penetrating through the organic film layer, in an area where the fourth via hole is located; and forming a common electrode layer at a side, facing away from the first passivation layer, of the organic film layer, and forming a via hole, penetrating through the common electrode layer, in an area where the fourth via hole is located.

In some embodiments, the first via hole penetrates through the gate insulating layer and the buffer layer; the second via hole penetrates through the gate insulating layer and the buffer layer.

DETAILED DESCRIPTION OF THE EMBODIMENTS

In order to make objectives, technical solutions and advantages of the embodiments of the present disclosure clearer, the technical solutions in some embodiments of the present disclosure will be described clearly and completely below in combination with accompanying drawings in some embodiments of the present disclosure. Obviously, the described embodiments are a part of the embodiments of the present disclosure, not all the embodiments. Based on the described embodiments of the present disclosure, all other embodiments obtained by those of ordinary skill in the art without creative work shall fall within the protective scope of the present disclosure.

Unless otherwise defined, technical terms or scientific terms used in the present disclosure shall be ordinary meanings as understood by those of ordinary skill in the art of the present disclosure. The words "first", "second" and the like used in the present disclosure do not denote any order, quantity or importance, but are merely used to distinguish different components. The word "include" or "comprise" and the like means that the element or object preceding the word covers the element or object listed after the word and its equivalent, without excluding other elements or objects. The words "connection" or "connected" and the like are not limited to physical or mechanical connections, but may include electrical connections, whether direct or indirect.

"Upper", "lower", "left", "right" and the like are merely used for denoting a relative positional relationship, and after an absolute position of a described object is changed, it is possible that the relative positional relationship is correspondingly changed.

In order to keep the following description of the embodiments of the present disclosure clear and simple, detailed descriptions of known functions and known components are omitted in the present disclosure.

Figure 1:
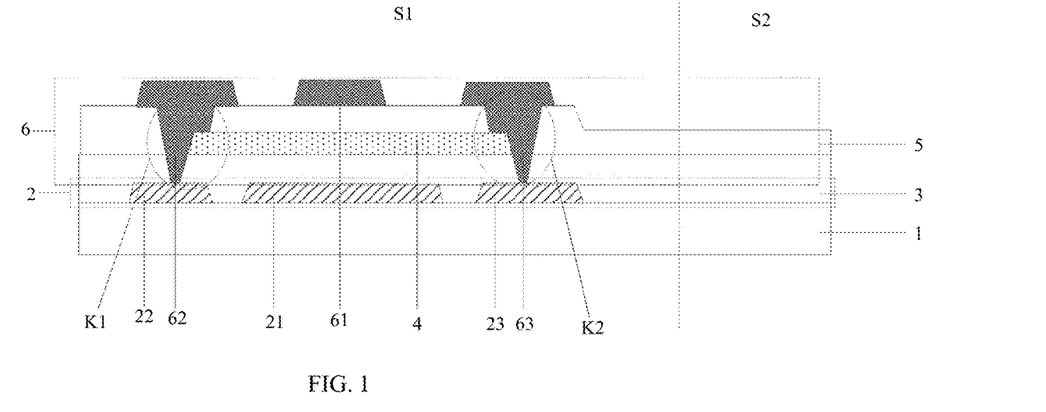
FIG. 1 is a schematic structural diagram showing an array substrate provided in an embodiment of the present disclosure.

Referring to FIG. 1, an embodiment of the present disclosure provides an array substrate provided with a display area S1 and a non-display area S2 located at the periphery of the display area S1. The array substrate includes:

a base substrate 1;

a first metal layer 2 located at one side of the base substrate 1, the first metal layer 2 including a light shielding part 21, a source 22 and a drain 23 which are located in the display area S1;

a buffer layer 3 located at a side, facing away from the base substrate 1, of the first metal layer 2;

an active layer 4 located at a side, facing away from the first metal layer 2, of the buffer layer 3 and located in the display area S1;

a gate insulating layer 5 located at a side, facing away from the buffer layer 3, of the active layer 4; and a second metal layer 6 located at a side, facing away from the active layer 4, of the gate insulating layer 5, wherein the second metal layer 6 includes a gate 61, a source landing electrode 62 and a drain landing electrode 63 which are located in the display area S1, the source landing electrode 62 is in contact with the active layer 4 and the source 22 through a first via hole K1 penetrating through the gate insulating layer 5 and the buffer layer 3 and exposing one end (for example, the left end of the active layer 4 in FIG. 1) of the active layer 4, and the drain landing electrode 63 is in contact with the active layer 4 and the drain 23 through a second via hole K2 penetrating through the gate insulating layer 5 and the buffer layer 3 and exposing the other end (for example, the right end of the active layer 4 in FIG. 1) of the active layer 4.

In some embodiments, a quantity of layers through which the first via hole penetrates is equal to a quantity of layers through which the second via hole penetrates.

The array substrate provided by the embodiment of the present disclosure includes the first metal layer and the second metal layer; the first metal layer includes the light shielding part, the source and the drain; the second metal layer includes the gate, the source landing electrode and the drain landing electrode, the source landing electrode is in simultaneous contact with the active layer and the source through the first via hole, and the drain landing electrode is in simultaneous contact with the active layer and the drain through the second via hole; the light shielding part, the source and the drain are arranged on the same layer; the gate, the source landing electrode and the drain landing electrode are arranged on the same layer; the source and the drain are formed while the light shielding part is formed; and the source landing electrode and the drain landing electrode are formed while the gate is formed. Compared with the related art in which the light shielding part is required to be fabricated by adopting a separate masking process, a source layer and a drain layer are required to be fabricated by adopting a separate masking process, and a gate layer is required to be fabricated by adopting a separate masking process, the embodiment of the present disclosure lies in that one of the masking processes may be reduced when the light shielding part, the source and the drain as well as the gate layer are fabricated, and furthermore, the problem of complicated fabrication process due to the requirement for multiple masking processes when the array substrate of a display is fabricated in the related art may be relieved.

Figure 2:
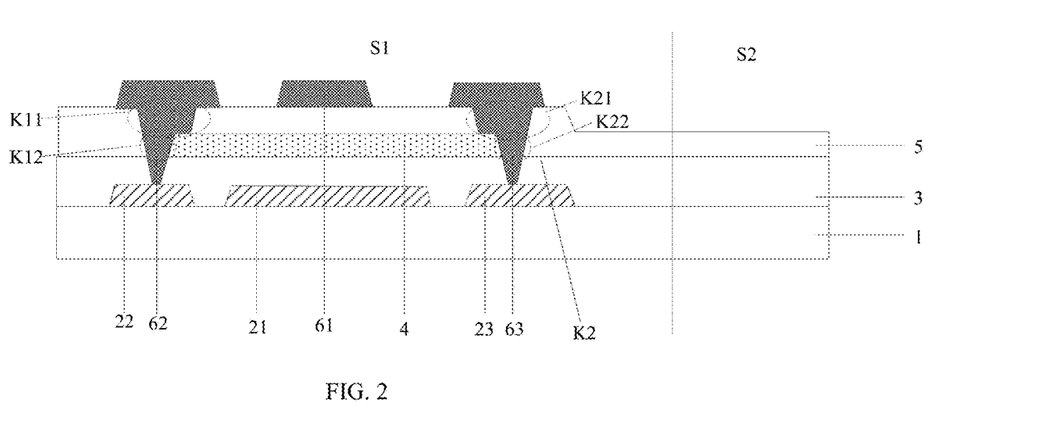
FIG. 2 is a schematic structural diagram showing a first via hole including a first part and a second part provided in an embodiment of the present disclosure.

In some embodiments, as shown in FIG. 1 and FIG. 2, the first via hole K1 is provided with a first part K11 and a second part K12 on the gate insulating layer 5, the first part K11 is located at the side, facing away from the buffer layer 3, of the active layer 4, the second part K12 is located on the same layer with the active layer 4, and an orthographic projection of the first part K11 on the base substrate 1 covers an orthographic projection of the second part K12 on the base substrate 1; and the second via hole K2 is provided with a third part K21 and a fourth part K22 on the gate insulating layer 5, the third part K21 is located at the side, facing away from the buffer layer 3, of the active layer 4, the fourth part K22 is located on the same layer with the active layer 4, and an orthographic projection of the third part K21 on the base substrate 1 covers an orthographic projection of the fourth part K22 on the base substrate 1. In some embodiments of the present disclosure, the first via hole K1 is provided with the first part K11 and the second part K12 on the gate insulating layer 5, the first part K11 is located at the side, facing away from the buffer layer 3, of the active layer 4, the second part K12 is located on the same layer with the active layer 4, the second via hole K2 is provided with the third part K21 on the gate insulating layer 5, the third part K21 is located at the side, facing away from the buffer layer 3, of the active layer 4, the orthographic projection of the first part K11 on the base substrate 1 covers the orthographic projection of the second part K12 on the base substrate 1, and the orthographic projection of the third part K21 on the base substrate 1 covers the orthographic projection of the fourth part K22 on the base substrate 1, that is, the first part K1*l* is greater than the second part K12, and thus, subsequently, the source 22 not only may be in lap joint with one end of the active layer 4, but also may be in lap joint with the source 22 located below; and in the same way, the third part K21 is greater than the fourth part K22, and thus, subsequently, the drain 23 not only may be in lap joint with the other end of the active layer 4, but also may be in lap joint with the drain 23 located below.

In some embodiments, the gate insulating layer 5 and the buffer layer 4 may be simultaneously etched by adopting a dry etching process to form the first via hole K1 and the second via hole K2 penetrating through the gate insulating layer 5 and the buffer layer 4. Optionally, due to gas selection in dry etching, it is possible in an etching process that a position where the first via hole K1 is located is partially etched to the active layer 4, and is partially etched to the source 22, so that a position where the second via hole K2 is located is partially etched to the active layer 4 and is partially etched to the drain 23, but the active layer 4 may not be penetrated.

Figure 3:
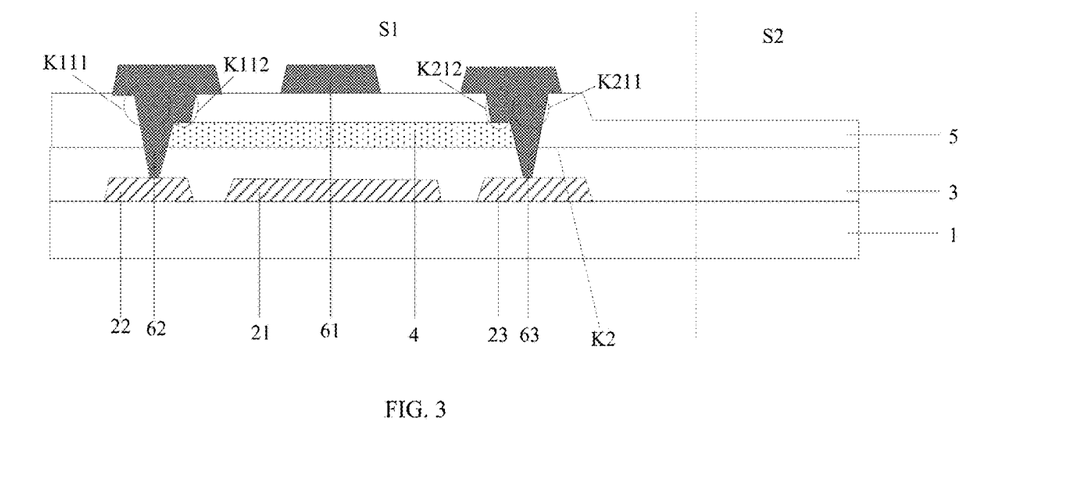
FIG. 3 is a schematic structural diagram showing a first part including a first subpart and a second subpart provided in an embodiment of the present disclosure.

In some embodiments, as shown in FIG. 2 and FIG. 3, the first part K11 includes a first subpart K111 in contact with the second part K12 and a second subpart K112 connected with the first subpart K111, the first via hole K1 exposes one end of the active layer 4 through the second subpart K112; and the third part K21 includes a third subpart K211 in contact with the fourth part K22 and a fourth subpart K212 connected with the third subpart K211, and the second via hole K2 exposes the other end of the active layer 4 through the fourth subpart K212. In some embodiments of the present disclosure, the first part K11 includes the second subpart K112 exposing one end of the active layer 4 and the first subpart K111 not exposing the active layer 4, and furthermore, the subsequentially formed source landing part 62 is partially in lap joint with the active layer 4 and is partially in lap joint with the source 22; and in the same way, the third subpart K211 includes the fourth subpart K212 exposing the other end of the active layer 4 and the third subpart K211 not exposing the active layer 4, and furthermore, the subsequentially formed drain landing part 63 is partially in lap joint with the active layer 4 and is partially in lap joint with the drain 23.

Figure 4:
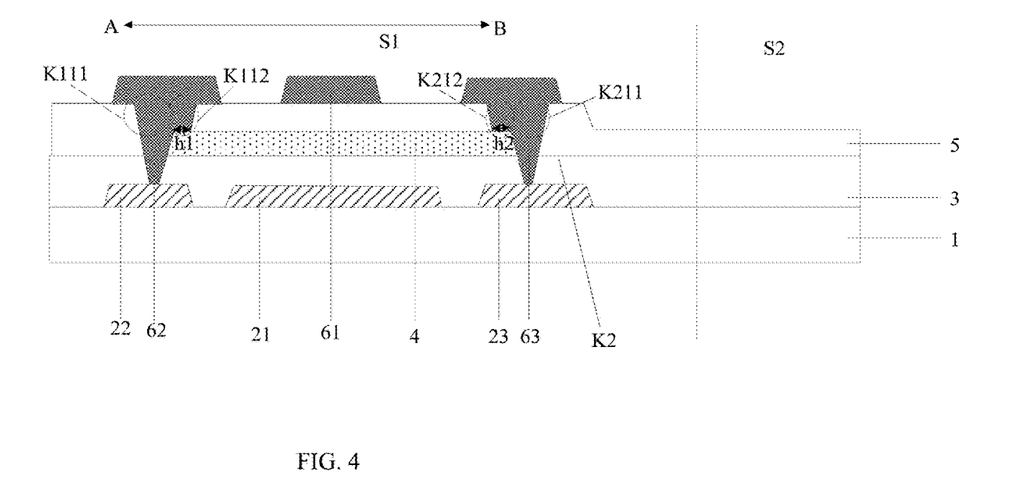
FIG. 4 is a schematic diagram showing the size of a second subpart in a first direction provided in an embodiment of the present disclosure.

In some embodiments, as shown in FIG. 4, the length h1 of a surface, in contact with the active layer 4, of the second subpart K112 is 3-5 micrometers in a direction parallel to a first direction AB; the length h2 of a surface, in contact with the active layer 4, of the fourth subpart K212 is 3-5 micrometers in the direction parallel to the first direction AB; wherein the first direction AB is a direction where the source landing electrode 62 points to the gate 61. In some embodiments of the present disclosure, there are limitations on the aperture exposure precision of an exposure machine (for example, the aperture exposure precision is 1 micrometer, the line width exposure precision is 1 micrometer, and the alignment precision is 1 micrometer), the length h1 of the surface, in contact with the active layer 4, of the second subpart K112 is 3-5 micrometers in the direction parallel to the first direction AB; the length h2 of the surface, in contact with the active layer 4, of the fourth subpart K212 is 3-5 micrometers in the direction parallel to the first direction AB, and thus, the subsequentially formed source landing part 62 may be effectively in lap joint with the source 22 and the drain landing part 63 may be effectively in lap joint with the drain 23 while the second subpart K112 and the fourth subpart K212 are fabricated, so that the problem that effective contact may not be realized due to oversmall size and problems (such as signal interference) in other aspects may be caused due to overlarge size are avoided.

Figure 5:
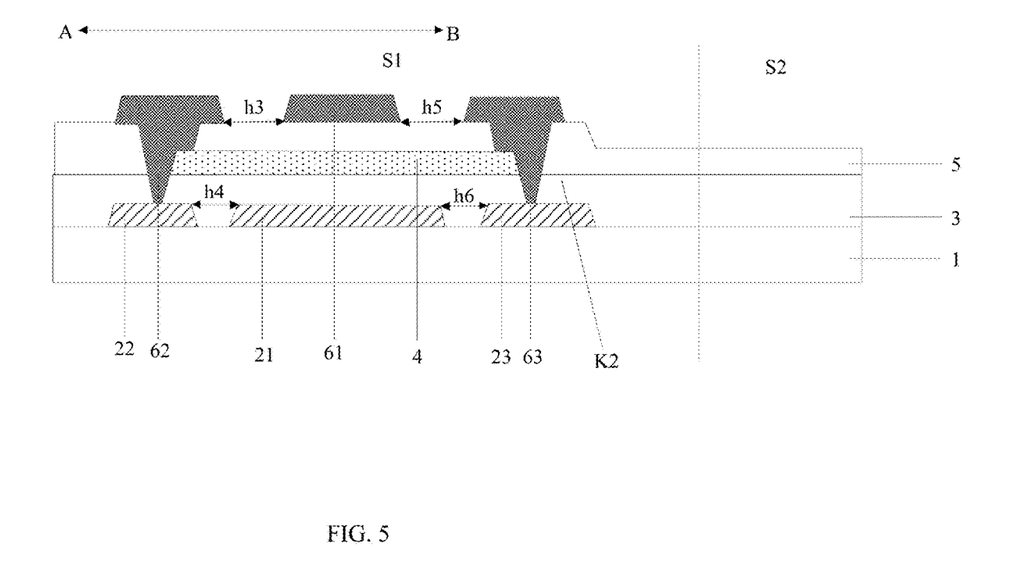
FIG. 5 is a schematic diagram showing a dimension of a gap formed between a source landing electrode and a gate and a dimension of a gap formed between a source and a light shielding part provided in an embodiment of the present disclosure.

In some embodiments, as shown in FIG. 5, a minimum dimension h3 of a gap formed between the source landing electrode 62 and the gate 61 in the direction parallel to the first direction AB is greater than a maximum dimension h4 of a gap formed between the source 22 and the light shielding part 21 in the direction parallel to the first direction AB; and a minimum dimension h5 of a gap formed between the drain landing electrode 63 and the gate 61 in the direction parallel to the first direction AB is greater than a maximum dimension h6 of a gap formed between the drain 23 and the light shielding part 21 in the direction parallel to the first direction AB. In some embodiments of the present disclosure, since the area of the light shielding part 21 is required to be greater than the area of the gate 61, h3 is greater than h4, h5 is greater than h6, and thus, a channel area, which is formed in an area, corresponding to the gate 61, of the active layer 4 may be effectively shielded by the light shielding part 21.

Figure 6:
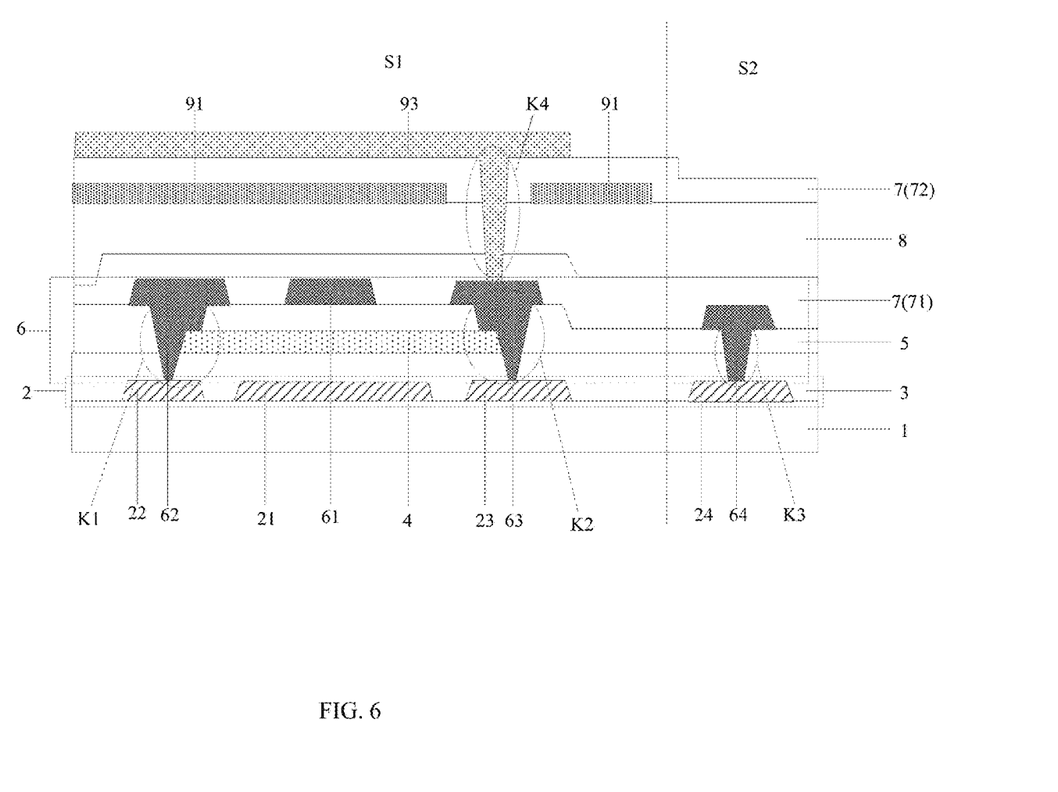
FIG. 6 is a specific schematic structural diagram showing an array substrate provided in an embodiment of the present disclosure.

In some embodiments, as shown in FIG. 6, the first metal layer 2 further includes a first signal line 24 located in the non-display area S2; and the second metal layer 6 further includes a second signal line 64 located in the non-display area S2, wherein the second signal line 64 and the first signal line 24 are conductive through a third via hole K3 penetrating through the gate insulating layer 5 and the buffer layer 3, so that the first signal line 24 is in lap joint with the second signal line 64. The first signal line 24 may be specifically a clock signal line or a frame starting signal line. In some embodiments of the present disclosure, the first metal layer 2 further includes the first signal line 24 located in the non-display area S2; and the second metal layer 6 further includes the second signal line 64 located in the non-display area S2. The first signal line 24 may be formed while the light shielding part 21 is fabricated, the second signal line 64 may be formed while the gate 61 is formed, and thus, a fabrication process of a display panel may be further simplified.

In some embodiments, the first metal layer 2 further includes a data line (unshown in the figure) which is located in the display area S1 and extends in a second direction; and the second metal layer further includes a gate line (unshown in the figure) which is located in the display area and extends in a third direction, and the third direction and the second direction may be perpendicular to each other. In some embodiments of the present disclosure, the first metal layer 2 further includes the data line which is located in the display area S1 and extends in the second direction; and the second metal layer further includes the gate line which is located in the display area and extends in the third direction. The data line may be formed while the light shielding part 21 is fabricated, the gate line may be formed while the gate 61 is formed, and thus, a fabrication process of the display panel may be further simplified.

In some embodiments, as shown in FIG. 6, the array substrate further includes: a passivation layer 7 located at the side, facing away from the gate insulating layer, of the second metal layer 6; and a pixel electrode 93 located at a side, facing away from the second metal layer 6, of the passivation layer 7 and located in the display area. The pixel electrode 93 and the drain landing electrode 63 are conductive through a fourth via hole K4 penetrating through the passivation layer 7. The passivation layer may include a first passivation layer 71 and a second passivation layer 72 located at the side, facing away from the second metal layer 6, of the first passivation layer 71; provided between the first passivation layer 71 and the second passivation layer 72 are: an organic film layer 8 located at the side, facing away from the second metal layer 6, of the first passivation layer 71, the organic film layer 8 being provided with a via hole in an area where the fourth via hole K4 is located; and a common electrode layer 91 located at a side, facing away from the first passivation layer 71, of the organic film layer 8 and located in the display area S1, the common electrode layer 91 being provided with a via hole in the area where the fourth via hole K4 is located.

Based on the same inventive concept, an embodiment of the present disclosure further provides a display device, including the array substrate provided by the embodiment of the present disclosure.

Figure 7:
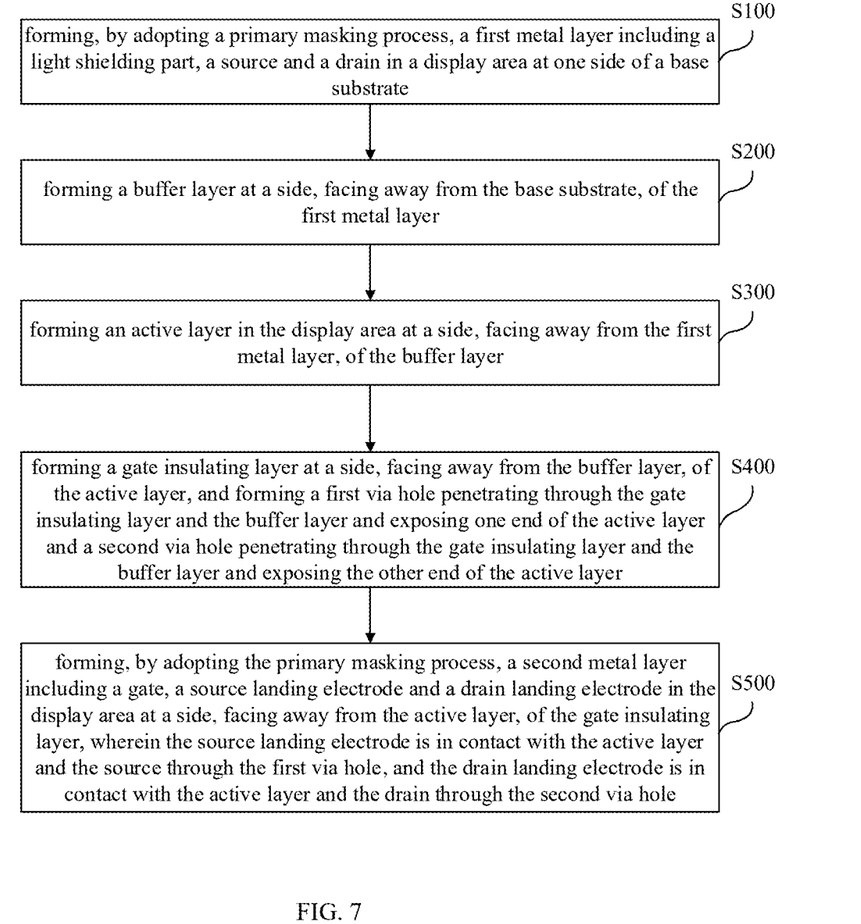
FIG. 7 is a flow chart showing the fabrication of an array substrate provided in an embodiment of the present disclosure.

Based on the same inventive concept, an embodiment of the present disclosure further provides a fabrication method of an array substrate, wherein the array substrate is provided with a display area and a non-display area located at the periphery of the display area. As shown in FIG. 7, the fabrication method includes:

S100, a first metal layer including a light shielding part, a source and a drain is formed in the display area at one side of a base substrate by adopting a primary masking process; optionally, when the light shielding part, the source and the drain are formed in the display area at one side of the base substrate, it is possible that a first signal line is formed in the non-display area at one side of the base substrate, and a data line extending in a second direction is formed in the display area at one side of the base substrate;

S200, a buffer layer is formed at a side, facing away from the base substrate, of the first metal layer;

S300, an active layer is formed in the display area at a side, facing away from the first metal layer, of the buffer layer;

S400, a gate insulating layer is formed at a side, facing away from the buffer layer, of the active layer, and a first via hole penetrating through the gate insulating layer and the buffer layer and exposing one end of the active layer and a second via hole penetrating through the gate insulating layer and the buffer layer and exposing the other end of the active layer are formed; optionally, the gate insulating layer and the buffer layer may be simultaneously etched by adopting a dry etching process to form the first via hole and the second via hole; a quantity of layers through which the first via hole penetrates is equal to a quantity of layers through which the second via hole penetrates; and S500, a second metal layer including a gate, a source landing electrode and a drain landing electrode is formed in the display area at a side, facing away from the active layer, of the gate insulating layer by adopting the primary masking process, wherein the source landing electrode is in contact with the active layer and the source through the first via hole, and the drain landing electrode is in contact with the active layer and the drain through the second via hole; optionally, when the gate, the source landing electrode and the drain landing electrode are formed in the display area at the side, facing away from the active layer, of the gate insulating layer, it is possible that a second signal line is formed in the non-display area at the side, facing away from the active layer, of the gate insulating layer, and a gate line extending in a third direction is formed in the display area at the side, facing away from the active layer, of the gate insulating layer, wherein the second signal line and the first signal line are conductive through a third via hole penetrating through the gate insulating layer and the buffer layer.

According to the fabrication method of the array substrate provided by embodiments of the present disclosure, the first metal layer including the light shielding part, the source and the drain is formed in the display area at one side of the base substrate by adopting a primary masking process; the second metal layer including the gate, the source landing electrode and the drain landing electrode is formed in the display area at the side, facing away from the active layer, of the gate insulating layer by adopting the primary masking process; the source and the drain are formed while the light shielding part is formed; and the source landing electrode and the drain landing electrode are formed while the gate is formed. Compared with the related art in which the light shielding part is required to be fabricated by adopting a separate masking process, a source layer and a drain layer are required to be fabricated by adopting a separate masking process, and a gate layer is required to be fabricated by adopting a separate masking process, the embodiment of the present disclosure lies in that one of the masking processes may be reduced when the light shielding part, the source and the drain as well as the gate layer are fabricated, and furthermore, the problem of complicated fabrication process due to the requirement on multiple masking processes when the array substrate of a display is fabricated in the prior art may be relieved.

Figure 8:
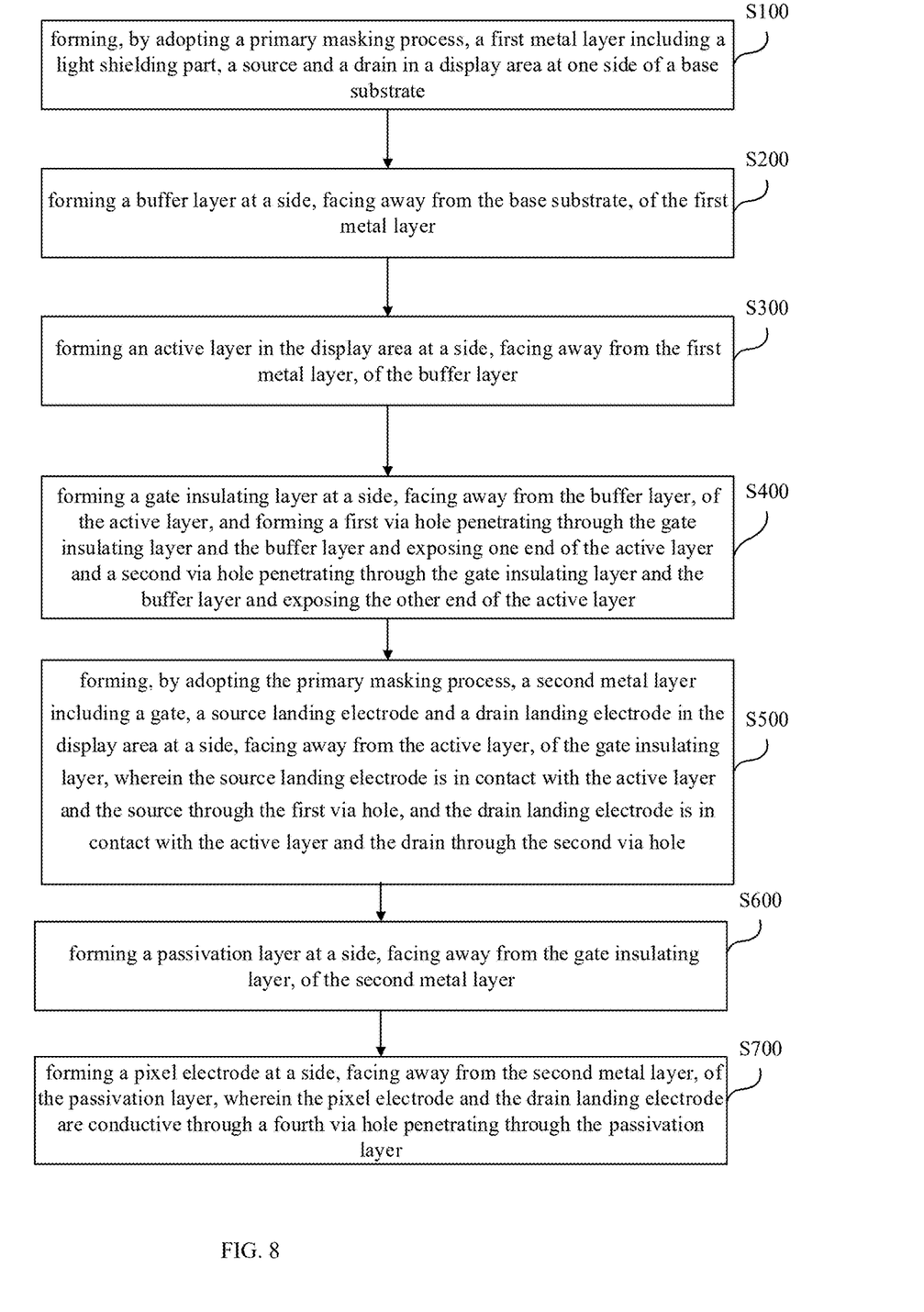
FIG. 8 is a flow chart showing the specific fabrication of an array substrate provided in an embodiment of the present disclosure.

In some embodiments, as shown in FIG. 8, after the S500, that is, after the second metal layer including the gate, the source landing electrode and the drain landing electrode is formed in the display area at the side, facing away from the active layer, of the gate insulating layer, the fabrication method further includes:

S600, a passivation layer is formed at a side, facing away from the gate insulating layer, of the second metal layer; and S700, a pixel electrode is formed at a side, facing away from the second metal layer, of the passivation layer, wherein the pixel electrode and the drain landing electrode are conductive through a fourth via hole penetrating through the passivation layer.

Figure 9:
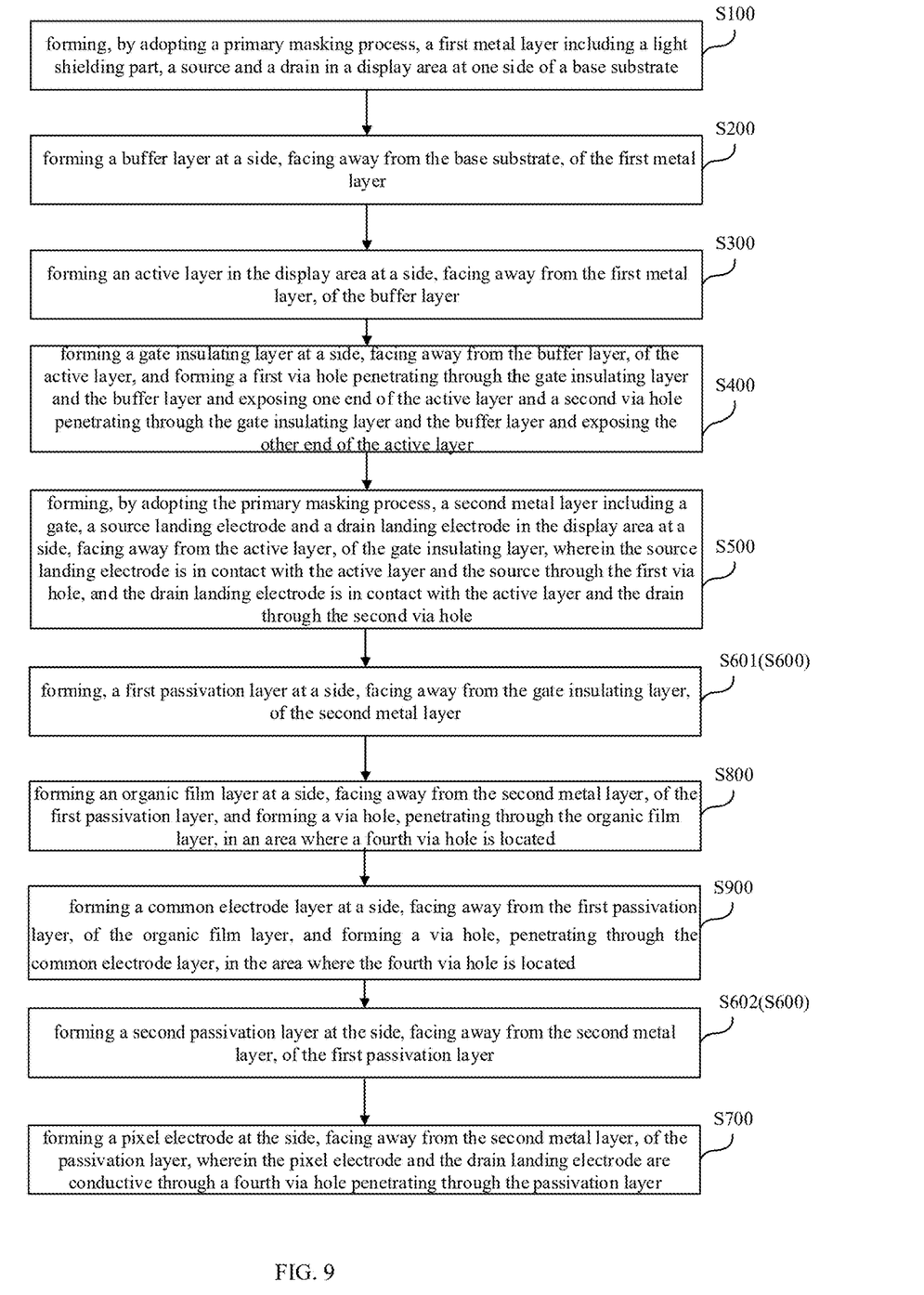
FIG. 9 is a flow chart showing another specific fabrication of an array substrate provided in an embodiment of the present disclosure.

In some embodiments, as shown in FIG. 9, the S600 in which the passivation layer is formed at the side, facing away from the gate insulating layer, of the second metal layer includes:

S601, a first passivation layer is formed at the side, facing away from the gate insulating layer, of the second metal layer;

S602, a second passivation layer is formed at a side, facing away from the second metal layer, of the first passivation layer;

wherein after the S601 and before the S602, that is, after the first passivation layer is formed at the side, facing away from the gate insulating layer, of the second metal layer, and before the second passivation layer is formed at the side, facing away from the second metal layer, of the first passivation layer, the fabrication method further includes:

S800, an organic film layer is formed at the side, facing away from the second metal layer, of the first passivation layer, and a via hole penetrating through the organic film layer is formed in an area where the fourth via hole is located; and S900, a common electrode layer is formed at a side, facing away from the first passivation layer, of the organic film layer, and a via hole penetrating through the common electrode layer is formed in the area where the fourth via hole is located.

Figure 10:
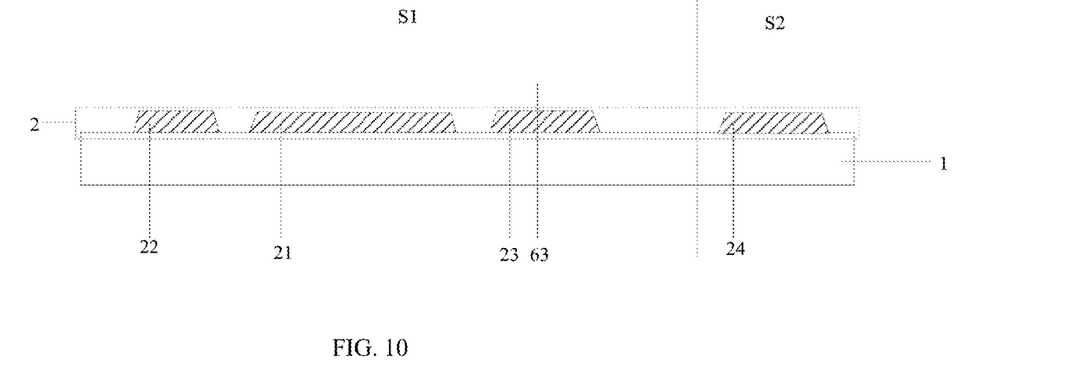
FIG. 10 is a schematic structural diagram showing an array substrate formed with a first metal layer in an embodiment of the present disclosure.
Figure 11:
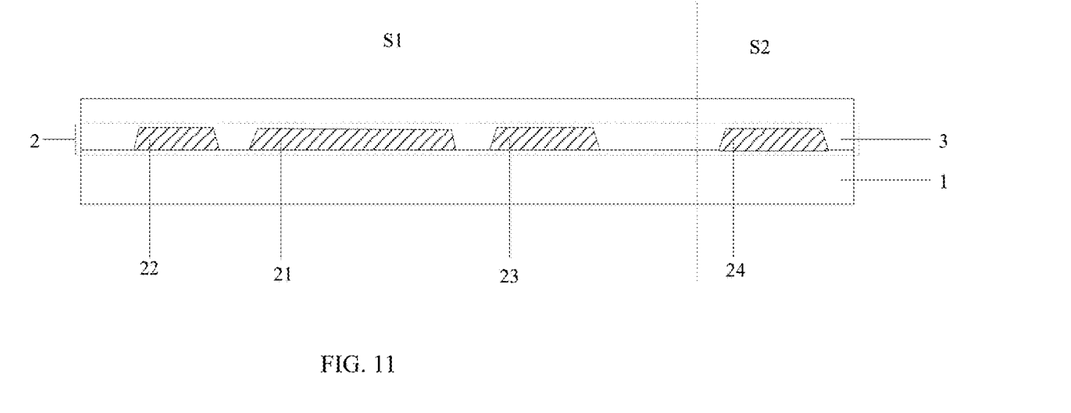
FIG. 11 is a schematic structural diagram showing an array substrate formed with a buffer layer in an embodiment of the present disclosure.
Figure 12:
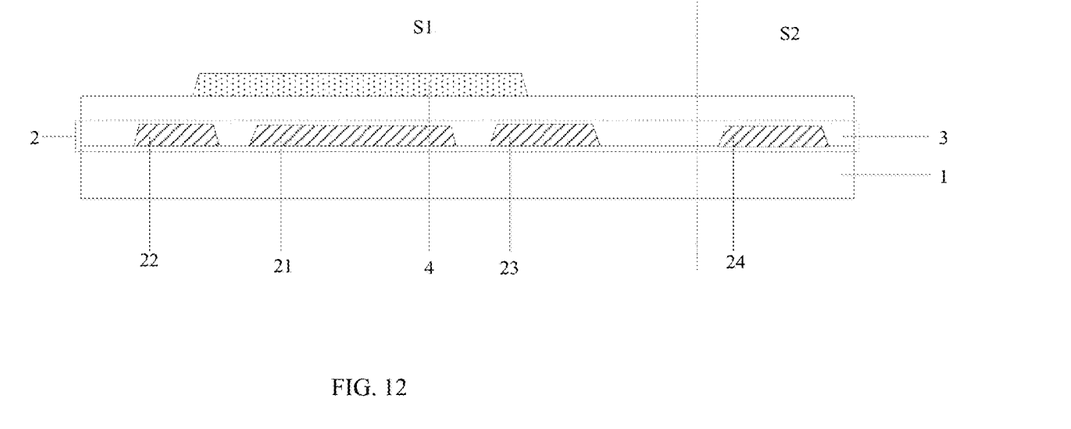
FIG. 12 is a schematic structural diagram showing an array substrate formed with an active layer in an embodiment of the present disclosure.
Figure 13:
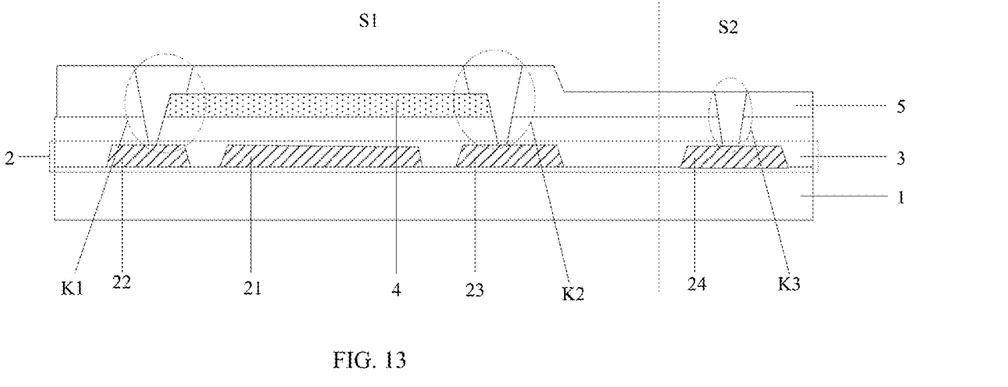
FIG. 13 is a schematic structural diagram showing an array substrate formed with a gate insulating layer in an embodiment of the present disclosure.
Figure 14:
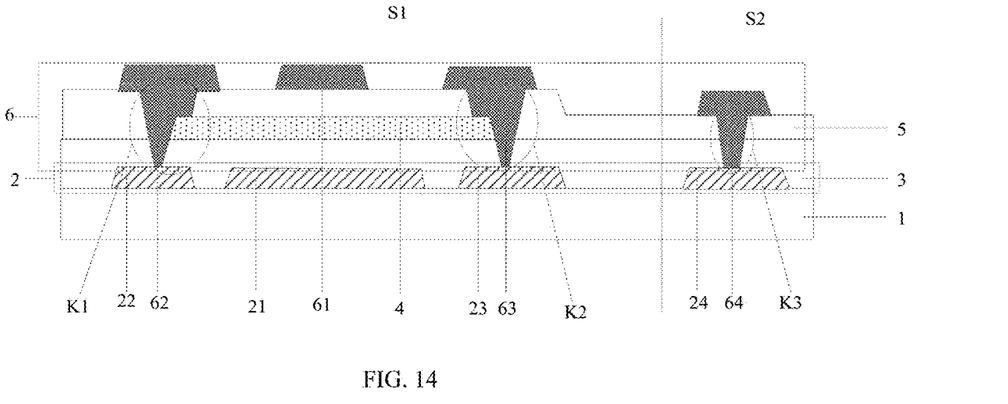
FIG. 14 is a schematic structural diagram showing an array substrate formed with a second metal layer in an embodiment of the present disclosure.
Figure 15:
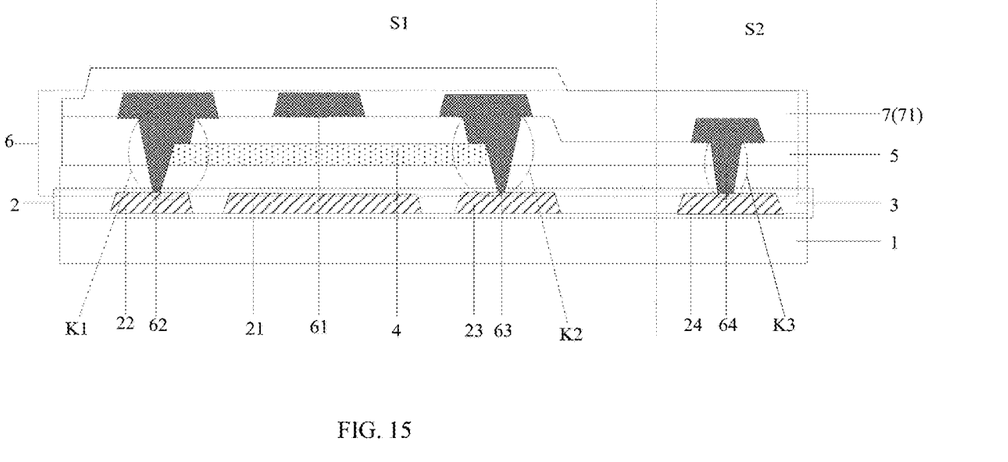
FIG. 15 is a schematic structural diagram showing an array substrate formed with a first passivation layer in an embodiment of the present disclosure.
Figure 16:
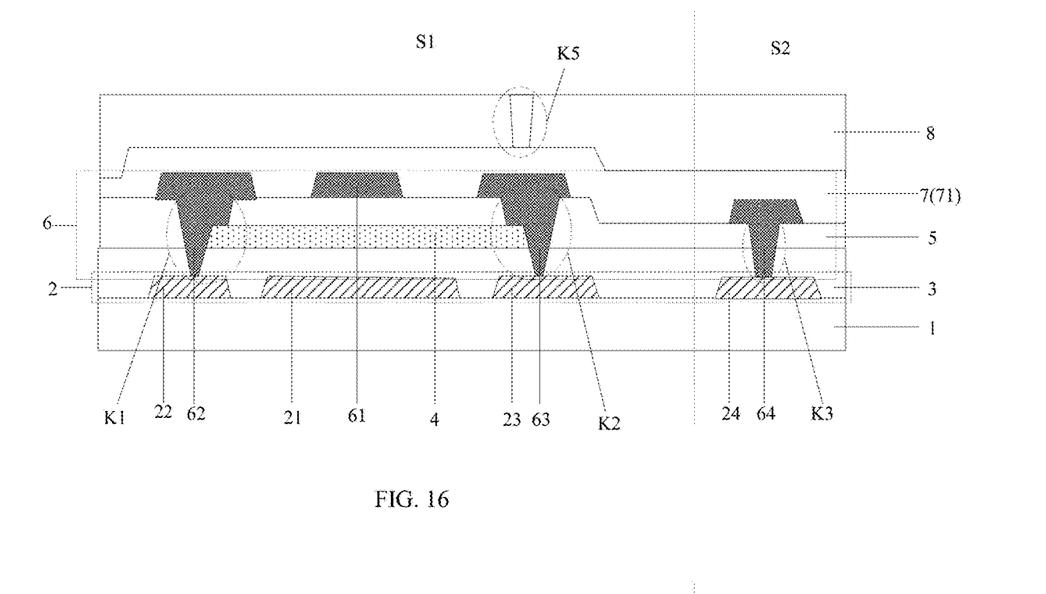
FIG. 16 is a schematic structural diagram showing an array substrate formed with an organic film layer in an embodiment of the present disclosure.
Figure 17:
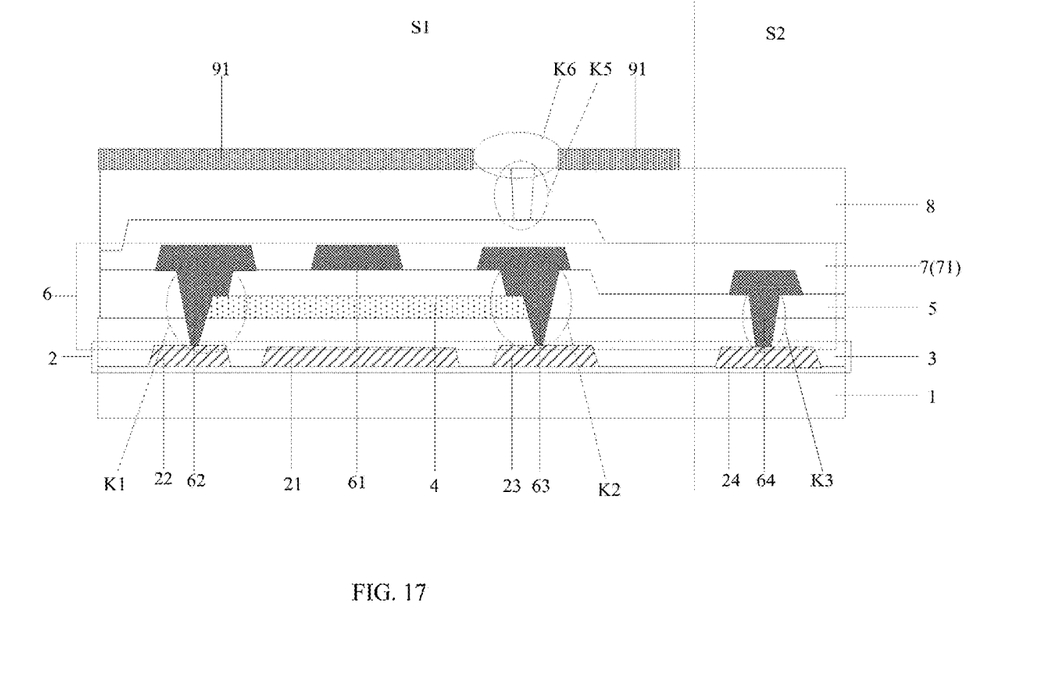
FIG. 17 is a schematic structural diagram showing an array substrate formed with a common electrode layer in an embodiment of the present disclosure.
Figure 18:
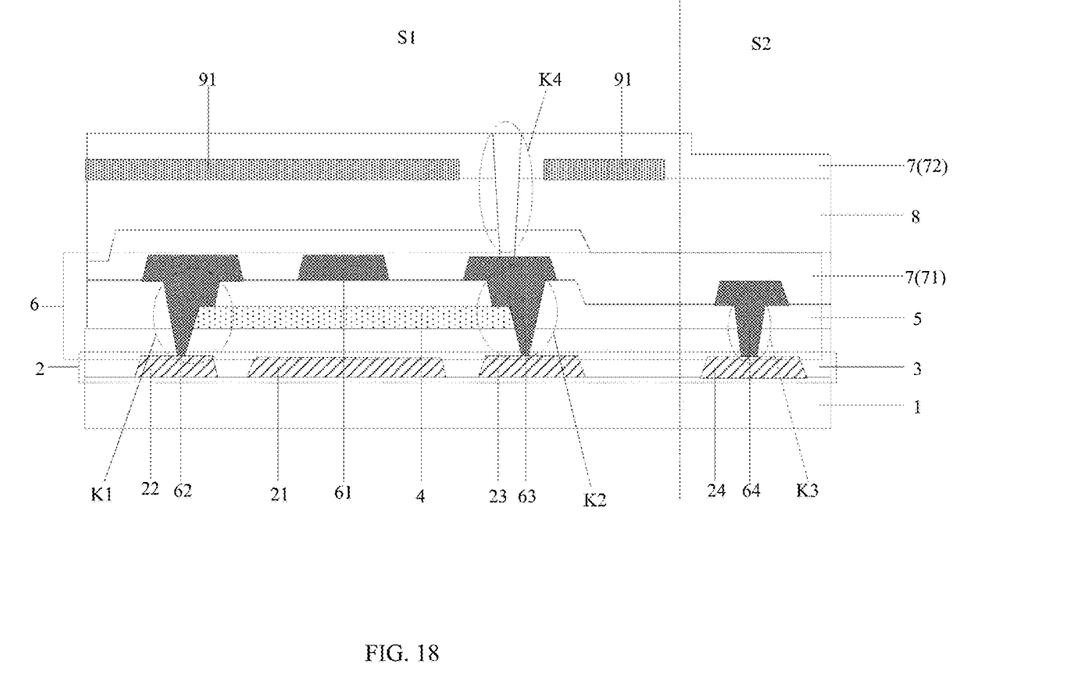
FIG. 18 is a schematic structural diagram showing an array substrate formed with a second passivation layer in an embodiment of the present disclosure.

In order to more clearly understand the fabrication method of the array substrate provided by the embodiment of the present disclosure, the fabrication method will be further described in detail below in combination with FIG. 10 to FIG. 18:

step 1, a first metal layer 2 is deposited on a base substrate 1 (which may be a glass substrate), patterns of a light shielding part 21, a source 22 and a drain 23 are formed in a display area S1 by adopting photoetching and dry etching technologies, and a first signal line 24 is formed in a non-display area S2, as shown in FIG. 10;

step 2, a buffer layer 3 is deposited to isolate the subsequentially fabricated light shielding part 21 and active layer 4 (the active layer may be made of indium gallium zinc oxide (IGZO), as shown in FIG. 11;

step 3, the active layer 4 is deposited, and a pattern of the active layer 4 is formed by adopting photoetching and wet etching technologies, as shown in FIG. 12;

step 4, a gate insulating layer 5 is deposited, the gate insulating layer 5 and the buffer layer 3 are simultaneously etched by adopting a drying etching process to form a first via hole K1, a second via hole K2 and a third via hole K3, a half of the first via hole K1 is connected with the source 22, and the other half of the first via hole K1 is connected with one end of the active layer 4, a half of the second via hole K2 is connected with the drain 23, and the other half of the second via hole K2 is connected with the other end of the active layer 4, as shown in FIG. 13;

step 5, a second metal layer 6 is deposited, patterns of a gate 61, a source landing electrode 62, a drain landing electrode 63 and a second signal line 64 are formed by adopting photoetching and wet etching technologies, the source landing electrode 62 is in simultaneous contact with the source 22 and one end of the active layer 4 through the first via hole K1, the drain landing electrode 63 is in contact with the drain 23 and the other end of the active layer 4 through the second via hole K2, and the second signal line 64 and the first signal line 24 are conductive through the third via hole K3, as shown in FIG. 14;

step 6, a first passivation layer 71 is deposited, as shown in FIG. 15;

step 7, an organic film layer 8 is coated, and an organic film via hole K5 is formed by adopting a photoetching technology, as shown in FIG. 16;

step 8, a first layer of indium tin oxide (ITO) film is deposited, and a pattern of a common electrode layer 91 and an ITO via hole K6 are formed by adopting photoetching and wet etching technologies, as shown in FIG. 17;

step 9, a second passivation layer 72 is deposited, and the first passivation layer 71 and a second passivation layer 72 are simultaneously etched by adopting photoetching and wet etching technologies to form a fourth via hole K4, as shown in FIG. 18; and step 10, a second layer of ITO film, and a pattern of a pixel electrode 93 is formed by adopting photoetching and wet etching technologies, as shown in FIG. 6.

The embodiments of the present disclosure have the beneficial effects described as follows: the array substrate provided by embodiments of the present disclosure includes the first metal layer and the second metal layer; the first metal layer includes the light shielding part, the source and the drain; the second metal layer includes the gate, the source landing electrode and the drain landing electrode, the source landing electrode is in simultaneous contact with the active layer and the source through the first via hole, and the drain landing electrode is in simultaneous contact with the active layer and the drain through the second via hole; the light shielding part, the source and the drain are arranged on the same layer; the gate, the source landing electrode and the drain landing electrode are arranged on the same layer; the source and the drain are formed while the light shielding part is formed; and the source landing electrode and the drain landing electrode are formed while the gate is formed. Compared with the prior art in which the light shielding part is required to be fabricated by adopting the separate masking process, a source layer and a drain layer are required to be fabricated by adopting the separate masking process, and the gate layer is required to be fabricated by adopting the separate masking process, the present disclosure lies in that one of the masking processes may be reduced when the light shielding part, the source and the drain as well as the gate layer are fabricated, and furthermore, the problem of complicated fabrication process due to the requirement on multiple masking processes when the array substrate of the display is fabricated in the prior art may be relieved.

Obviously, those skilled in the art can make various changes and modifications on the present disclosure without departing from the spirit and scope of the present disclosure. Thus, if such changes and modifications of the present disclosure fall within the scope of the claims of the present disclosure and equivalent technologies thereof, the present disclosure is also intended to encompass these changes and modifications.

What is claimed is:

1. An array substrate, comprising a display area and a non-display area located at a periphery of the display area, wherein the array substrate comprises:
   a base substrate;
   a first metal layer located at one side of the base substrate, the first metal layer comprises a light shielding part, a source; the light shielding part, and the source are located in the display area;
   a buffer layer located at a side, facing away from the base substrate, of the first metal layer;
   an active layer located at a side, facing away from the first metal layer, of the buffer layer and located in the display area;
   a gate insulating layer located at a side, facing away from the buffer layer, of the active layer; and
   a second metal layer located at a side, facing away from the active layer, of the gate insulating layer, wherein the second metal layer comprises a gate, a source landing electrode;
   the source landing electrode is in contact with the active layer and the source through a first via hole,
   wherein the first metal layer further comprises a first signal line located in the non-display area; and
   the second metal layer further comprises a second signal line located in the non-display area, wherein the second signal line and the first signal line are conductive through a third via hole penetrating through the gate insulating layer and the buffer layer.

2. The array substrate according to claim 1, wherein the first via hole exposes one end of the active layer.

3. The array substrate according to claim 1, wherein the first via hole penetrates through the gate insulating layer and the buffer layer; the second via hole penetrates through the gate insulating layer and the buffer layer.

4. The array substrate according to claim 1, wherein the first metal layer further comprises a data line which is located in the display area and extends in a second direction; and
   the second metal layer further comprises a gate line which is located in the display area and extends in a third direction.

5. A display device, comprising the array substrate according to claim 1.

6. The array substrate according to claim 1, further comprises:
   a passivation layer located at a side, facing away from the gate insulating layer, of the second metal layer; and
   a pixel electrode located at a side, facing away from the second metal layer, of the passivation layer and located in the display area, wherein the pixel electrode and the drain landing electrode are conductive through a fourth via hole penetrating through the passivation layer.

7. The array substrate according to claim 6, wherein the passivation layer comprises a first passivation layer and a second passivation layer located at a side, facing away from the second metal layer, of the first passivation layer;
   an organic film layer located at the side, facing away from the second metal layer, of the first passivation layer, the organic film layer comprises a via hole in an area where the fourth via hole is located; and
   a common electrode layer located at a side, facing away from the first passivation layer, of the organic film layer and located in the display area, the common electrode layer comprises a via hole in the area where the fourth via hole is located.

8. The array substrate according to claim 1, wherein the first metal layer further comprises a drain, the second metal layer further comprises a drain landing electrode.

9. The array substrate according to claim 8, wherein the drain landing electrode is in contact with the active layer and the drain through a second via hole exposing the other end of the active layer;
   wherein a quantity of layers through which the first via hole penetrates is equal to a quantity of layers through which the second via hole penetrates.

10. The array substrate according to claim 8, wherein at least two side surface of the active layer is in lap joint with the source landing electrode, or the drain landing electrode.

11. The array substrate according to claim 1, wherein the first via hole comprises a first part and a second part on the gate insulating layer, the first part is located at a side, facing away from the buffer layer, of the active layer, the second part is located on a layer same with a layer where the active layer is, and an orthographic projection of the first part on the base substrate covers an orthographic projection of the second part on the base substrate; and
   the second via hole comprises a third part and a fourth part on the gate insulating layer, the third part is located at the side, facing away from the buffer layer, of the active layer, the fourth part is located on the layer same with the layer where the active layer is, and an orthographic projection of the third part on the base substrate covers an orthographic projection of the fourth part on the base substrate.

12. The array substrate according to claim 11, wherein the first part comprises a first subpart in contact with the second part and a second subpart connected with the first subpart, the first via hole exposes one end of the active layer through the second subpart; and
   the third part comprises a third subpart in contact with the fourth part and a fourth subpart connected with the third subpart, and the second via hole exposes the other end of the active layer through the fourth subpart.

13. The array substrate according to claim 12, wherein a length of a surface, in contact with the active layer, of the second subpart is 3-5 micrometers in a direction parallel to a first direction;
   a length of a surface, in contact with the active layer, of the fourth subpart is 3-5 micrometers in the direction parallel to the first direction;
   wherein the first direction is a direction where the source landing electrode points to the gate.

14. The array substrate according to claim 13, wherein a minimum dimension of a gap formed between the source landing electrode and the gate in the direction parallel to the first direction is greater than a maximum dimension of a gap formed between the source and the light shielding part in the direction parallel to the first direction; and
   a minimum dimension of a gap formed between the drain landing electrode and the gate in the direction parallel to the first direction is greater than a maximum dimension of a gap formed between the drain and the light shielding part in the direction parallel to the first direction.

15. An array substrate, comprising: a display area and a non-display area located at a periphery of the display area, wherein the array substrate comprises:
   a base substrate;
   a first metal layer located at one side of the base substrate, the first metal layer comprises a light shielding part, a source; the light shielding part, and the source are located in the display area;

a buffer layer located at a side, facing away from the base substrate, of the first metal layer;

an active layer located at a side, facing away from the first metal layer, of the buffer layer and located in the display area;

a gate insulating layer located at a side, facing away from the buffer layer, of the active layer; and a second metal layer located at a side, facing away from the active layer, of the gate insulating layer, wherein the second metal layer comprises a gate, a source landing electrode; the source landing electrode is in contact with the active layer and the source through a first via hole, wherein the first metal layer further comprises a first signal line located in the non-display area; and the second metal layer further comprises a second signal line located in the non-display area, wherein the second signal line and the first signal line are conductive through a third via hole penetrating through the gate insulating layer and the buffer layer;

a side surface facing the first via hole, of the active layer is closer to a center of the first via hole than a side surface facing the first via hole, of the gate insulating layer.

16. The array substrate according to claim 15, wherein the first via hole exposes one end of the active layer.

17. The array substrate according to claim 15, wherein the first metal layer further comprises a data line which is located in the display area and extends in a second direction; and the second metal layer further comprises a gate line which is located in the display area and extends in a third direction.

18. The array substrate according to claim 15, wherein the first metal layer further comprises a drain, the second metal layer further comprises a drain landing electrode.

19. The array substrate according to claim 18, wherein the drain landing electrode is in contact with the active layer and the drain through a second via hole exposing the other end of the active layer;

wherein a quantity of layers through which the first via hole penetrates is equal to a quantity of layers through which the second via hole penetrates.

20. The array substrate according to claim 18, wherein at least two side surface of the active layer is in lap joint with the source landing electrode, or the drain landing electrode.

* * * * *